(12) United States Patent
Luo et al.

(10) Patent No.: US 11,424,262 B2
(45) Date of Patent: Aug. 23, 2022

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventors: Shuangqiang Luo, Boise, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 101 days.

(21) Appl. No.: 16/821,818

(22) Filed: Mar. 17, 2020

(65) Prior Publication Data

US 2021/0296342 A1    Sep. 23, 2021

(51) Int. Cl.
*H01L 27/11573* (2017.01)
*H01L 27/1157* (2017.01)
(Continued)

(52) U.S. Cl.
CPC .... *H01L 27/11573* (2013.01); *H01L 27/1157* (2013.01); *H01L 27/11529* (2013.01); *H01L 27/11556* (2013.01); *H01L 27/11582* (2013.01)

(58) Field of Classification Search
CPC ......................................... H01L 27/115–11597
See application file for complete search history.

(56) References Cited

U.S. PATENT DOCUMENTS 8,624,300 B2    1/2014  Tang et al.
9,070,442 B2    6/2015  Yip et al.
(Continued)

FOREIGN PATENT DOCUMENTS

KR    10-2017-0014757 A    2/2017

OTHER PUBLICATIONS

International Search Report for Application No. PCT/US2021/018567, dated Jun. 10, 2021, 3 pages.
(Continued)

*Primary Examiner* — Ismail A Muse
*Assistant Examiner* — Gustavo G Ramallo
(74) *Attorney, Agent, or Firm* — TraskBritt

(57) ABSTRACT

A microelectronic device comprises a stack structure, a stadium structure within the stack structure, a source tier underlying the stack structure, and a masking structure. The stack structure has tiers each comprising a conductive structure and an insulating structure. The stadium structure comprises a forward staircase structure, a reverse staircase structure, and a central region horizontally interposed between the forward staircase structure and the reverse staircase structure. The source tier comprises discrete conductive structures within horizontal boundaries of the central region of the stadium structure and horizontally separated from one another by dielectric material. The masking structure is confined within the horizontal boundaries of the central region of the stadium structure and is vertically interposed between the source tier and the stack structure. The masking structure comprises segments horizontally covering portions of the dielectric material horizontally interposed between the discrete conductive structures. Additional devices and electronic systems are also described.

23 Claims, 6 Drawing Sheets

(51) Int. Cl.
*H01L 27/11582* (2017.01)
*H01L 27/11529* (2017.01)
*H01L 27/11556* (2017.01)

(56) References Cited

U.S. PATENT DOCUMENTS

| | | | |
|---|---|---|---|
| 9,449,987 B1 | 9/2016 | Miyata et al. | |
| 9,589,978 B1 | 3/2017 | Yip | |
| 9,786,375 B2 | 10/2017 | Goda et al. | |
| 9,853,046 B2 | 12/2017 | Lu et al. | |
| 9,905,575 B2 | 2/2018 | Lee | |
| 9,941,209 B2 | 4/2018 | Tessariol et al. | |
| 10,074,430 B2 | 9/2018 | Sakui | |
| 10,090,318 B2 | 10/2018 | Zhu et al. | |
| 10,229,923 B2 | 3/2019 | Dorhout et al. | |
| 10,256,249 B2 | 4/2019 | Dorhout et al. | |
| 10,263,007 B2 | 4/2019 | Dorhout et al. | |
| 10,269,625 B1 | 4/2019 | Matovu et al. | |
| 10,283,520 B2 | 5/2019 | Hopkins et al. | |
| 10,453,748 B2 | 10/2019 | Park et al. | |
| 10,580,795 B1 | 3/2020 | Luo et al. | |
| 2001/0017388 A1* | 8/2001 | Ponomarev | H01L 29/78648 257/347 |
| 2002/0081782 A1 | 6/2002 | Cleeves | |
| 2008/0186777 A1* | 8/2008 | Jones | H01L 27/11521 365/185.24 |
| 2014/0048945 A1 | 2/2014 | Lim et al. | |
| 2015/0162084 A1 | 6/2015 | Morooka et al. | |
| 2015/0255478 A1 | 9/2015 | Tanzawa | |
| 2015/0279852 A1 | 10/2015 | Mizutani et al. | |
| 2016/0104717 A1 | 4/2016 | Lu et al. | |
| 2017/0256551 A1 | 9/2017 | Lee | |
| 2017/0294383 A1 | 10/2017 | Tanzawa | |
| 2018/0019255 A1 | 1/2018 | Hopkins et al. | |
| 2018/0040623 A1 | 2/2018 | Kanakamedala et al. | |
| 2018/0082940 A1 | 3/2018 | Sorensen et al. | |
| 2018/0308858 A1 | 10/2018 | Hopkins et al. | |
| 2018/0366198 A1 | 12/2018 | Sakui | |
| 2019/0013329 A1 | 1/2019 | Lu et al. | |
| 2019/0103406 A1 | 4/2019 | Tang et al. | |
| 2019/0280000 A1 | 9/2019 | Nakamura et al. | |
| 2020/0066752 A1 | 2/2020 | Lee | |
| 2020/0357811 A1* | 11/2020 | Kim | H01L 27/11582 |

OTHER PUBLICATIONS

Written Opinion of the International Searching Authority for Application No. PCT/US2021/018567, dated Jun. 10, 2021, 3 pages.
Taiwanese First Office Action for Application No. 110107323, dated Oct. 4, 2021, 3 pages.

* cited by examiner

MICROELECTRONIC DEVICES INCLUDING STAIRCASE STRUCTURES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to microelectronic devices including stadium structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called "staircase" (or "stair step") structures at edges (e.g., horizontal ends) of the tiers of conductive structures. A staircase structure includes individual "steps" defining contact regions of the conductive structures upon which conductive contact structures can be positioned to provide electrical access to the conductive structures. So-called "stadium" structures may be formed to include opposing staircase structures.

As vertical memory array technology has advanced, additional memory density has been provided by forming vertical memory arrays to include additional tiers of conductive structures, and, hence, additional staircase structures and/or additional steps in individual staircase structures associated therewith. However, as feature packing densities have increased and margins for formation errors have decreased, conventional configurations have resulted in undesirable defects (e.g., delamination defects, such as source plate delaminations effectuated by the fill of trenches horizontally neighboring relatively vertically lower staircase structures with dielectric material; etching defects, such as over etching resulting from chopping processes used to form relatively vertically lower staircase structures) that can diminish desired memory device performance, reliability, and durability.

Accordingly there remains a need for new microelectronic device (e.g., memory device, such as 3D NAND Flash memory device) configurations facilitating enhanced memory density while alleviating the problems of conventional microelectronic device configurations, as well as for new electronic systems including the new microelectronic device configurations.

DETAILED DESCRIPTION

Figure 1A:
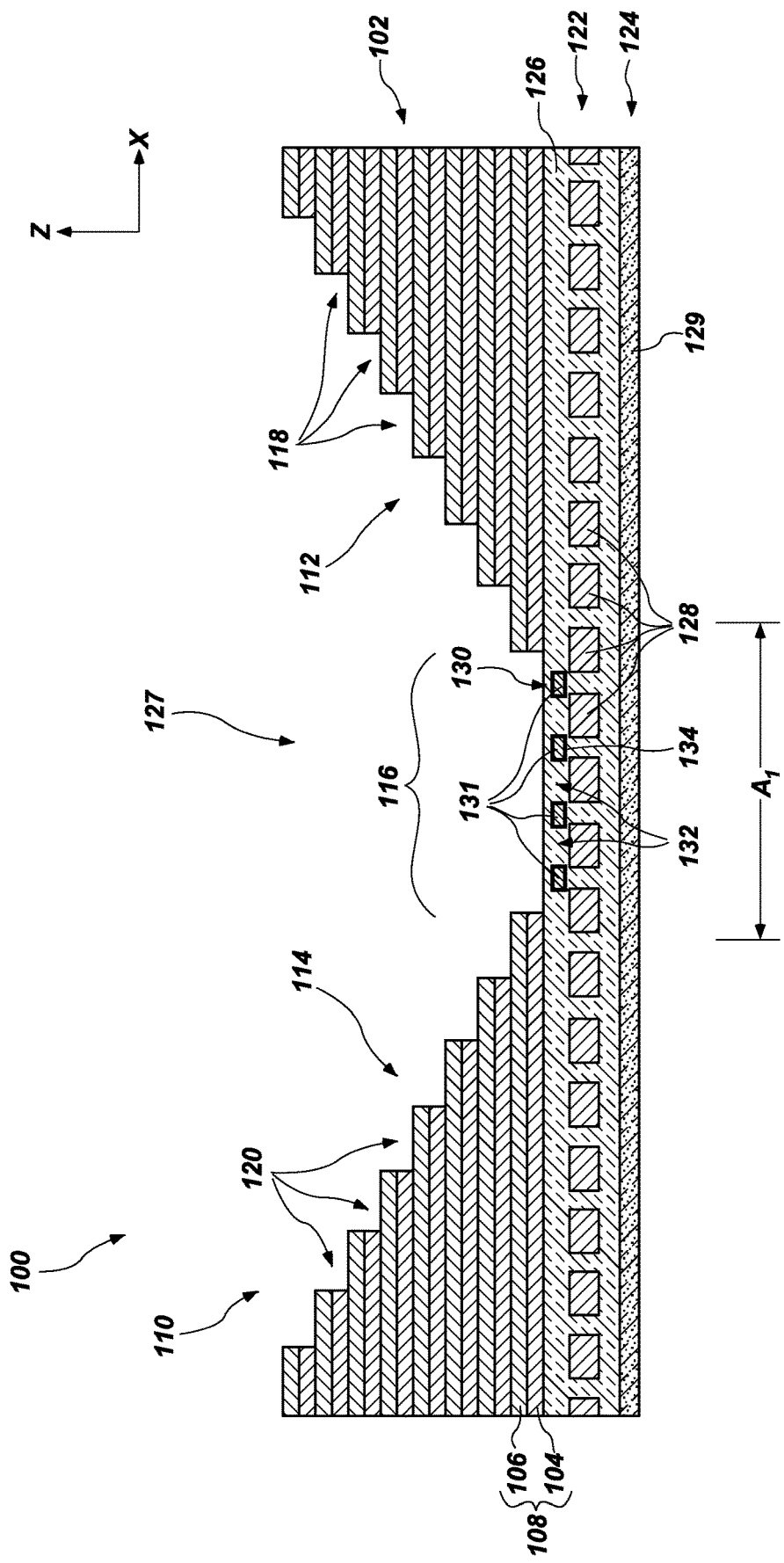
FIG. 1A is a simplified, partial cross-sectional view of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Figure 1B:
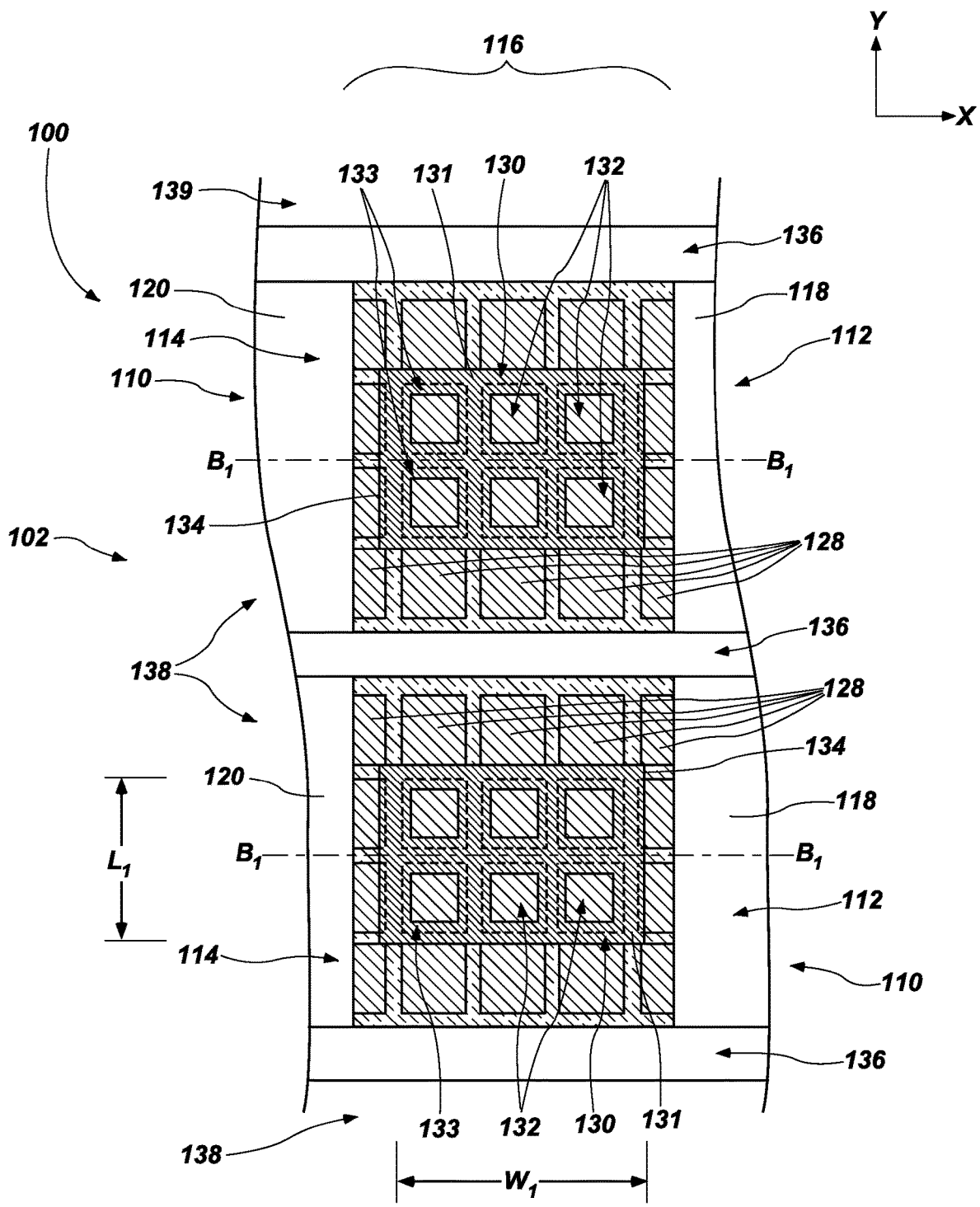
FIG. 1B is a simplified, partial top-down view of a section of the microelectronic device structure shown in FIG. 1A.

FIG. 1A is a simplified, partial cross-sectional view of a microelectronic device structure 100 of a microelectronic device (e.g., a semiconductor device; a memory device, such as a 3D NAND Flash memory device), in accordance with embodiments of the disclosure. The microelectronic device structure 100 may, for example, comprise a portion of a memory device (e.g., a 3D NAND Flash memory device). FIG. 1B is a simplified, partial top-down view of a section $A_1$ (e.g., portion, region) of the microelectronic device structure 100 shown in FIG. 1A. For clarity and ease of understanding of the drawings and related description, some vertically higher components (e.g., features, structures, devices) of the microelectronic device structure 100 overlying relatively vertically lower components of the microelectronic device structure 100 have been omitted in FIG. 1B to focus on particular aspects of the microelectronic device structure 100 in FIG. 1B.

Referring to FIG. 1A, the microelectronic device structure 100 includes a stack structure 102 including a vertically alternating (e.g., in the Z-direction) sequence of conductive structures 104 (e.g., access line plates, word line plates) and insulative structures 106 arranged in tiers 108. Each of the tiers 108 of the stack structure 102 may include at least one (1) of the conductive structures 104 vertically neighboring at least one (1) of the insulative structures 106. The stack structure 102 may include a desired quantity of the tiers 108. For example, the stack structure 102 may include greater than or equal to ten (10) of the tiers 108, greater than or equal to twenty-five (25) of the tiers 108, greater than or equal to fifty (50) of the tiers 108, greater than or equal to one hundred (100) of the tiers 108, greater than or equal to one hundred and fifty (150) of the tiers 108, or greater than or equal to two hundred (200) of the tiers 108 of the conductive structures 104 and the insulative structures 106.

The conductive structures 104 of the tiers 108 of the stack structure 102 may be formed of and include one or more electrically conductive materials, such as one or more of at least one metal (e.g., one or more of tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), and aluminum (Al)), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, and a stainless steel), at least one conductively doped semiconductor material (e.g., one or more of conductively doped polysilicon, conductively doped germanium (Ge), and conductively doped silicon germanium (SiGe)), and at least one conductive metal-containing material (e.g., one or more of a conductive metal nitride, a conductive metal silicide, a conductive metal carbide, and a conductive metal oxide). In some embodiments, the conductive structures 104 are formed of and include W. Each of the conductive structures 104 may individually include a substantially homogeneous distribution of the at least one electrically conductive material, or a substantially heterogeneous distribution of the at least one electrically conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 of each of the tiers 108 of the stack structure 102 exhibits a substantially homogeneous distribution of electrically conductive material. In additional embodiments, at least one of the conductive structures 104 of at least one of the tiers 108 of the stack structure 102 exhibits a substantially heterogeneous distribution of at least one electrically conductive material. The conductive structure 104 may, for example, be formed of and include a stack of at least two different electrically conductive materials. The conductive structures 104 of each of the tiers 108 of the stack structure 102 may each be substantially planar, and may each exhibit a desired thickness.

The insulative structures 106 of the tiers 108 of the stack structure 102 may be formed of and include at least one dielectric material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulative structures 106 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulative structures 106 are formed of and include $SiO_2$. Each of the insulative structures 106 may individually include a substantially homogeneous distribution of the at least one insulating material, or a substantially heterogeneous distribution of the at least one insulating material. In some embodiments, each of the insulative structures 106 of each of the tiers 108 of the stack structure 102 exhibits a substantially homogeneous distribution of insulating material. In additional embodiments, at least one of the insulative structures 106 of at least one of the tiers 108 of the stack structure 102 exhibits a substantially heterogeneous distribution of at least one insulating material. The insulating structure 106 may, for example, be formed of and include a stack (e.g., laminate) of at least two different insulating materials. The insulative structures 106 of each of the tiers 108 of the stack structure 102 may each be substantially planar, and may each individually exhibit a desired thickness.

At least one lower conductive structure 104 of the stack structure 102 may be employed as at least one lower select gate (e.g., at least one source side select gate (SGS)) of the microelectronic device structure 100. In some embodiments, a single (e.g., only one) conductive structure 104 of a vertically lowermost tier 108 of the stack structure 102 is employed as a lower select gate (e.g., a SGS) of the microelectronic device structure 100. In addition, upper conductive structure(s) 104 of the stack structure 102 may be employed as upper select gate(s) (e.g., drain side select gate(s) (SGDs)) of the microelectronic device structure 100. In some embodiments, horizontally neighboring conductive structures 104 of a vertically uppermost tier 108 of the stack structure 102 are employed as upper select gates (e.g., SGDs) of the microelectronic device structure 100.

With continued reference to FIG. 1A, the microelectronic device structure 100 further includes at least one stadium structure 110 within the stack structure 102. In some embodiments, the stadium structure 110 is one of multiple (e.g., more than one) stadium structures included within the stack structure 102. The stadium structure 110 may, for example, be positioned at a different vertical elevation (e.g., depth in the Z-direction) than at least one other of the multiple stadiums structures, as descript in further detail below. In some embodiments, the stadium structure 110 is located at a lower vertical elevation within the stack structure 102 relative to one or more other stadium structures within the stack structure 102. For example, the stadium structure 110 may be located at a lowermost vertical elevation within the stack structure 102, such as a vertical elevation at or neighboring a lowermost vertical boundary of the stack structure 102.

As shown in FIG. 1A, the stadium structure 110 may include a forward staircase structure 112, a reverse staircase structure 114, and a central region 116 horizontally interposed between the forward staircase structure 112 and the reverse staircase structure 114. A phantom line extending from a top of the forward staircase structure 112 to a bottom of the forward staircase structure 112 may have a positive slope, and another phantom line extending from a top of the reverse staircase structure 114 to a bottom of the reverse staircase structure 114 may have a negative slope. The forward staircase structure 112 and the reverse staircase structure 114 of the stadium structures 210 may serve as redundant and/or alternative means of connecting to one or more of the tiers 108 of the stack structure 102. In additional embodiments, the stadium structure 110 exhibits a different configuration than that depicted in FIG. 1A. As a non-limiting example, the stadium structure 110 may be modified to include a forward staircase structure 112 but not a reverse staircase structure 114 (e.g., the reverse staircase structure 114 may be absent), or the stadium structure 110 may be modified to include a reverse staircase structure 114 but not a forward staircase structure 112 (e.g., the forward staircase structure 112 may be absent). In such embodiments, the central region 116 horizontally neighbors a bottom of the forward staircase structure 112 (e.g., if the reverse staircase structure 114 is absent), or horizontally neighbors a bottom of the reverse staircase structure 114 (e.g., if the forward staircase structure 112 is absent).

Still referring to FIG. 1A, the forward staircase structure 112 includes steps 118 (e.g., contact regions) defined by edges (e.g., horizontal ends) of the tiers 108 of the stack structure 102, and the reverse staircase structure 114 includes additional steps 120 (e.g., additional contact regions) defined by additional edges (e.g., additional horizontal ends) of the tiers 108. In some embodiments, the reverse staircase structure 114 mirrors the forward staircase structure 112. Each step 118 of the forward staircase structure 112 may have a counterpart additional step 120 within the reverse staircase structure 114 having substantially the same geometric configuration (e.g., shape, dimensions), vertical position (e.g., in the Z-direction), and horizontal distance (e.g., in the X-direction) from a horizontal center (e.g., in the X-direction) of the central region 116 of the stadium structure 110. In additional embodiments, the reverse staircase structure 114 does not mirror the forward staircase structure 112. For example, at least one step 118 of the forward staircase structure 112 may not have a counterpart additional step 120 within the reverse staircase structure 114 having substantially the same geometric configuration (e.g., shape, dimensions), vertical position (e.g., in the Z-direction), and/or horizontal distance (e.g., in the X-direction) from horizontal center (e.g., in the X-direction) of the central region 116 of the stadium structure 110; and/or at least one additional step 120 of the reverse staircase structure 114 may not have a counterpart step 118 within the forward staircase structure 112 having substantially the same geometric configuration (e.g., shape, dimensions), vertical position (e.g., in the Z-direction), and/or horizontal distance (e.g., in the X-direction) from horizontal center (e.g., in the X-direction) of the central region 116 of the stadium structure 110.

As shown in FIG. 1A, in some embodiments, the steps 118 of the forward staircase structure 112 and the additional steps 120 of the reverse staircase structure 114 are arranged in order, such that steps 118 of the forward staircase structure 112 directly horizontally adjacent one another in the X-direction correspond to tiers 108 of the stack structure 102 directly vertically adjacent (e.g., in the Z-direction) one another, and such that additional steps 120 of the reverse staircase structure 114 directly horizontally adjacent one another in the X-direction correspond to tiers 108 of the stack structure 102 directly vertically adjacent (e.g., in the Z-direction) one another. In additional embodiments, the steps 118 of the forward staircase structure 112 and/or the additional steps 120 of the reverse staircase structure 114 are arranged out of order, such that at least some steps 118 of the forward staircase structure 112 directly horizontally adjacent one another in the X-direction correspond to tiers 108 of stack structure 102 not directly vertically adjacent (e.g., in the Z-direction) one another, and/or such that at least some additional steps 120 of the reverse staircase structure 114 directly horizontally adjacent one another in the X-direction correspond to tiers 108 of stack structure 102 not directly vertically adjacent (e.g., in the Z-direction) one another.

With continued reference to FIG. 1A, the central region 116 of the stadium structure 110 horizontally intervenes (e.g., in the X-direction) and separates the forward staircase structure 112 and the reverse staircase structure 114 of the stadium structure 110. The central region 116 may horizontally neighbor a vertically lowermost step 118 of the forward staircase structure 112, and may also horizontally neighbor a vertically lowermost additional step 120 of the reverse staircase structure 114. In some embodiments, the central region 116 of the stadium structure 110 is defined by a portion of an upper boundary (e.g., an upper surface) of at least one structure directly vertically underlying the stack structure 102. The central region 116 of the stadium structure 110 may have any horizontal dimensions facilitating a pre-determined use of the microelectronic device structure 100 (including pre-determined uses of the stack structure 102 and the stadium structure 110 thereof) within a microelectronic device (e.g., a memory device, such as a 3D NAND memory device), as described in further detail below.

As shown in the FIG. 1A, the stadium structure 110 (including the forward staircase structure 112, the reverse staircase structure 114, and the central region 116 thereof) may at least partially define boundaries (e.g., horizontal boundaries, vertical boundaries) of a trench 127 vertically extending (e.g., in the Z-direction) through the stack structure 102. The trench 127 may only vertically extend through tiers 108 of the stack structure 102 defining the forward staircase structure 112 and the reverse staircase structure 114 of the stadium structure 110; or may also vertically extend through additional tiers 108 of the stack structure 102 not defining the forward staircase structure 112 and the reverse staircase structure 114 of the stadium structure 110, such as additional tiers 108 of the stack structure 102 vertically overlying the stadium structure 110. Edges of the additional tiers 108 of the stack structure 102 may, for example, define one or more additional stadium structures vertically overlying and horizontally offset from the stadium structure 110. The trench 127 may be filled with at least one dielectric fill material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the trench 127 is filled with Sift.

Referring to FIG. 1B, the stack structure 102 may be partitioned in the Y-direction orthogonal to the X-direction by slots 136. In some embodiments, the slots 136 vertically extend (e.g., in the Z-direction shown in FIG. 1A) completely through the stack structure 102. The slots 136 may divide (e.g., in the Y-direction) the stack structure 102 into multiple blocks 138. Each of the slots 136 may be filled with at least one dielectric fill material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. The dielectric fill material within the slots 136 may be substantially the same as or may be different than the dielectric fill material within the trench 127 (FIG. 1A). In some embodiments, each of the slots 136 is filled with $SiO_2$.

With returned reference to FIG. 1A, the microelectronic device structure 100 further includes a source tier 122 underlying the stack structure 102, and a conductive routing tier 124 (e.g., a metallization tier) underlying the source tier 122. The conductive routing tier 124 may be in electrical communication (e.g., by way of one or more conductive interconnect structures) with portions (e.g., different conductive structures) of the source tier 122, and may electrically connect the portions of the source tier 122 to components of a microelectronic device (e.g., a memory device) including the microelectronic device structure 100, as described in further detail below.

The source tier 122 includes discrete conductive structures 128 (e.g., discrete conductive island structures) horizontally separated (e.g., in the X-direction and in the Y-direction (FIG. 1B) perpendicular to the X-direction) from one another. The discrete conductive structures 128 may be located at substantially the same vertical position (e.g., in the Z-direction) within the microelectronic device structure 100 as one another. At least one dielectric material 126 may surround (e.g., horizontally surround, vertically surround) and be interposed between (e.g., in the X-direction and in the Y-direction (FIG. 1B)) the discrete conductive structures 128. The dielectric material 126 may vertical overlie and vertically underlie the discrete conductive structures 128 of the source tier 122, and may also horizontally intervene between and separate horizontally neighboring discrete conductive structures 128 of the source tier 122. The dielectric material 126 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric material 126 comprises $SiO_2$.

The discrete conductive structures 128 may each individually be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, and a conductive metal carbide, a conductive metal oxide), and at least one conductively doped semiconductor material (e.g., one or more of conductively doped Si, conductively doped Ge, and conductively doped SiGe). In some embodiments, the discrete conductive structures 128 are formed of and include conductively doped polycrystalline silicon. Each of the discrete conductive structures 128 may individually include a substantially homogeneous distribution of the at least one electrically conductive material, or a substantially heterogeneous distribution of the at least one electrically conductive material. In some embodiments, each of the discrete conductive structures 128 of the source tier 122 exhibits a substantially homogeneous distribution of electrically conductive material. In additional embodiments, at least one (e.g., each) of the discrete conductive structures 128 of the source tier 122 exhibits a substantially heterogeneous distribution of at least one conductive material. The discrete conductive structures 128 may, for example, individually be formed of and include a stack of at least two different conductive materials. In some embodiments, the discrete conductive structures 128 have substantially the same material composition and the same material distribution as one another. For example, the discrete conductive structures 128 may be formed (e.g., substantially simultaneously formed) by patterning (e.g., using a predetermined reticle configuration) the electrically conductive material(s).

The discrete conductive structures 128 may each individually exhibit any desired geometric configuration (e.g., dimensions and shape) and spacing. The geometric configurations and spacing of the discrete conductive structures 128 may be selected at least partially based on the configurations and positions of other components of the microelectronic device structure 100. In some embodiments, one or more (e.g., each) of the discrete conductive structures 128 exhibits a generally quadrilateral (e.g., generally rectangular, generally square) horizontal cross-sectional shape. Each of the discrete conductive structures 128 may exhibit substantially the same geometric configuration (e.g., the same dimensions and the same shape) and horizontal spacing (e.g., in the X-direction, in the Y-direction (FIG. 1B) orthogonal to the X-direction) as each other of the discrete conductive structures 128, or at least some of the discrete conductive structures 128 may exhibit a different geometric configuration (e.g., one or more different dimensions, a different shape) and/or different horizontal spacing than at least some other of the discrete conductive structures 128. In some embodiments, the discrete conductive structures 128 are at least partially non-uniformly spaced. For example, at least some horizontally neighboring discrete conductive structures 128 may be spaced apart from one another by a different distance than at least some other horizontally neighboring discrete conductive structures 128.

Referring to FIG. 1B, in some embodiments each of the blocks 138 of the stack structure 102 individually includes four (4) rows of the discrete conductive structures 128 vertically thereunder (e.g., in the Z-direction (FIG. 1A)) and substantially confined within horizontal boundaries (e.g., in the Y-direction and in the X-direction) thereof. Each row of the discrete conductive structures 128 may horizontally extend in the X-direction, and may individually include a portion of the discrete conductive structures 128 included in the source tier 122 (FIG. 1A). In additional embodiments, a different number of rows of the discrete conductive structures 128 is located vertically under and substantially confined within horizontal boundaries of one or more (e.g., each) of the blocks 138 of the stack structure 102. For example, each of the blocks 138 of the stack structure 102 may individually include greater than four (4) rows of the discrete conductive structures 128 vertically thereunder and substantially confined within horizontal boundaries thereof, or each of the blocks 138 of the stack structure 102 may individually include less than four (4) rows of the discrete conductive structures 128 vertically thereunder and substantially confined within horizontal boundaries thereof. In addition, as shown in FIG. 1B, columns of the discrete conductive structures 128 may also be positioned vertically under (e.g., in the Z-direction (FIG. 1A)) the stack structure 102, and may horizontally extend in the Y-direction orthogonal to the X-direction. In some embodiments, for each of the blocks 138 of the stack structure 102, three (3) columns of the discrete conductive structures 128 are completely positioned within horizontal boundaries in the X-direction of the central region 116 of the stadium structure 110, and two (2) columns of the discrete conductive structures are partially (e.g., less than completely) positioned within horizontal boundaries in the X-direction of the central region 116 of the stadium structure 110. In additional embodiments, a different quantity (e.g., greater than three (3), less than three (3)) of columns of the discrete conductive structures 128 are completely positioned within horizontal boundaries in the X-direction of the central region 116 of the stadium structure 110, and/or a different quantity (e.g., less than two (2)) of columns of the discrete conductive structures 128 are partially positioned within horizontal boundaries in the X-direction of the central region 116 of the stadium structure 110.

With returned reference to FIG. 1A, discrete conductive structures 128 of the source tier 122 within horizontal boundaries of the central region 116 of the stadium structure 110 may have improved delamination resistance during, for example, the formation (e.g., deposition) of dielectric fill material (e.g., Sift) within the trench 127 at least partially defined by the stadium structure 110 as compared to a single conductive structure that horizontally extends continuously from and between the horizontal boundaries of the central region 116 of the stadium structure 110. The segmented nature of the discrete conductive structures 128, as well as the dielectric material 126 surrounding and interposed between the discrete conductive structures 128, may, for example, better handle stresses imparted by the formation of the dielectric fill material that may otherwise at least partially delaminate a conventional, continuous conductive structure from materials vertically thereunder.

Still referring to FIG. 1A, some of the discrete conductive structures 128 of the source tier 122 may be electrically connected to the conductive routing tier 124, and other of the discrete conductive structures 128 of the source tier 122 may be electrically isolated from the conductive routing tier 124. For example, some of the discrete conductive structures 128 of the source tier 122 may be electrically connected (e.g., by way of vertically extending conductive interconnect structures) to conductive routing structures 129 (e.g., horizontally extending conductive structures) within the conductive routing tier 124. In turn, the conductive routing structures 129 of the conductive routing tier 124 may be electrically connected to additional structures and/or devices (e.g., back end of line (BEOL) devices; control logic devices, such as control logic devices including complementary metal-oxide-semiconductor (CMOS) circuitry) vertically underlying the source tier 122 of the microelectronic device structure 100. One or more dielectric materials (e.g., one or more of at least one dielectric oxide material, at least one dielectric nitride material, at least one dielectric oxynitride material, at least one dielectric carboxynitride material, and amorphous carbon) may be horizontally interposed between conductive routing structures 129 of the conductive routing tier 124.

With continued reference to FIG. 1A, the microelectronic device structure 100 further includes at least one masking structure 130 vertically overlying the discrete conductive structures 128 of the source tier 122 within horizontal boundaries of the central region 116 of the stadium structure 110. The masking structure 130 may individually include integral segments 131 (e.g., integral portions, integral sections) vertically overlying and substantially horizontally covering portions of the dielectric material 126 horizontally interposed between the discrete conductive structures 128 of the source tier 122 within horizontal boundaries of the central region 116 of the stadium structure 110. In addition, as shown in FIG. 1A, the masking structure 130 may further include openings 132 vertically extending therethrough and within horizontal boundaries of some of the discrete conductive structures 128 of the source tier 122 vertically underlying the masking structure 130. The openings 132 may be horizontally disposed between the integral segments 131 of the masking structure 130, and may have horizontal areas smaller than horizontal areas of the discrete conductive structures 128 vertically thereunder. Accordingly, the integral segments 131 of the masking structure 130 may horizontally overlap some of the discrete conductive structures 128 of the source tier 122 vertically underlying the masking structure 130. The masking structure 130 may be located within additional portions of the dielectric material 126 vertically overlying the discrete conductive structures 128 of the source tier 122. The dielectric material 126 may, for example, surround an outer periphery (e.g., outermost horizontal and vertical boundaries) of the masking structure 130, and may also fill the openings 132 in the masking structure 130.

The masking structure 130 may be formed of and include at least one material having different etch selectively than the dielectric material 126 surrounding and interposed between the discrete conductive structures 128. The masking structure 130 may, for example, be relatively more resistant to removal than the dielectric material 126 during interaction with at least one etchant employed to form the stadium structure 110 (and, hence, the trench 127) through at least one material removal process (e.g., at least one chopping process). The masking structure 130 may protect portions of the dielectric material 126 vertically thereunder and horizontally interposed between the discrete conductive structures 128 of the source tier 122 from removal during the material removal process. By protecting portions of the dielectric material 126 from removal during the material removal processes the masking structure 130 may also impede or prevent undesirable damage to one or more structures (e.g., one or more of the conductive routing structures 129 of the conductive routing tier 124) vertically underlying the source tier 122 of the microelectronic device structure 100.

By way of non-limiting example, the masking structure 130 may be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, and a conductive metal carbide, a conductive metal oxide), and at least one conductively doped semiconductor material (e.g., one or more of conductively doped Si, conductively doped Ge, conductively doped SiGe). In some embodiments, the masking structure 130 is formed of and includes W (e.g., elemental W). In additional embodiments, the masking structure 130 may be formed of and include one or more of at least one semiconductive material more resistant to removal than the dielectric material 126 during interaction with at least one etchant employed to form the stadium structure 110, and/or at least one other dielectric material more resistant to removal than the dielectric material 126 during interaction with at least one etchant employed to form the stadium structure 110. The masking structure 130 may include a substantially homogeneous distribution of material (e.g., electrically conductive material, semiconductive material, dielectric material), or a substantially heterogeneous distribution of material. In some embodiments, the masking structure 130 has a substantially homogeneous distribution of electrically conductive material (e.g., W). In additional embodiments, the masking structure 130 has a substantially heterogeneous distribution of one or more materials. The masking structure 130 may, for example, be formed of and include a stack of at least two different materials.

The masking structure 130 may exhibit a desired geometric configuration and a desired horizontal position (e.g., within the horizontal boundaries of the central region 116 of the stadium structure 110). As described in further detail below, the geometric configuration and the horizontal position of the masking structure 130 may be selected at least partially based on the geometric configurations and the horizontal positions of other components (e.g., the stack structure 102; the central region 116 of the stadium structure 110; the discrete conductive structures 128 of the source tier 122) of the microelectronic device structure 100. For example, masking structure 130 may have a geometric configuration and a horizontal position complementing the geometric configurations and the horizontal positions of the other components of the microelectronic device structure 100 so as to impede (e.g., substantially prevent) portions of the dielectric material 126 vertically thereunder and horizontally interposed between the discrete conductive structures 128 of the source tier 122 from being removed during one or more processes (e.g., a conventional chopping process) employed to form the stadium structure 110 (and, hence, the trench 127) in the stack structure 102.

Referring to FIG. 1B, within horizontal boundaries (e.g., in the X-direction, in the Y-direction) of each block 138 of the stack structure 102, a masking structure 130 may be horizontally positioned such that the integral segments 131 thereof intervene between horizontally neighboring discrete conductive structures 128 of the source tier 122 within horizontal boundaries of the central region 116 of the stadium structure 110. Outermost horizontal boundaries (e.g., a width W in the X-direction, and a length L in the Y-direction) of the masking structure 130 may be smaller than outermost horizontal boundaries of the portion of the block 138 within the horizontal boundaries of the central region 116 of the stadium structure 110. For example, for each block 138 of the stack structure 102, the masking structure 130 may horizontally extend (e.g., in the X-direction and the Y-direction) across less than all of the discrete conductive structures 128 located within the horizontal boundaries of the central region 116 of the stadium structure 110. As shown in FIG. 1B, for each block 138 of the stack structure 102, the masking structure 130 may horizontally extend in the X-direction across less than all columns of the discrete conductive structure 128 at least partially located within the horizontal boundaries of the central region 116 of the stadium structure 110, and may horizontally extend in the Y-direction across less than all rows of the discrete conductive structure 128 located within the horizontal boundaries of the central region 116 of the stadium structure 110. As a non-limiting example, if, for an individual block 138 of the stack structure 102, four (4) rows and (5) columns of the discrete conductive structures 128 are at least partially located within the horizontal boundaries of the central region 116 of the stadium structure 110, the masking structure 130 may horizontally extend in the Y-direction across and beyond a middle two (2) of the (4) four rows of the discrete conductive structures 128, but may not substantially horizontally extend in the Y-direction across an outer two (2) of the (4) four rows of the discrete conductive structures 128; and may horizontally extend in the X-direction across and beyond a middle three (3) of the (5) five columns of the discrete conductive structures 128, but may not substantially horizontally extend in the X-direction across an outer two (2) of the (5) five columns of the discrete conductive structures 128. In such embodiments, for the individual block 138 of the stack structure 102, only six (6) of the discrete conductive structures 128 are completely positioned within outermost horizontal boundaries of the masking structure 130. As shown in FIG. 1B, the masking structure 130 may partially horizontally overlap (e.g., in the X-direction) a middle two (2) (e.g., in the Y-direction) of the discrete conductive structures 128 within each of the outer two (2) of the (5) five columns of the discrete conductive structures 128, but may not horizontally overlap (e.g., in the Y-direction) any of the discrete conductive structures 128 within the outer two (2) of the (4) four rows of the discrete conductive structures 128. In some embodiments, the width W of the masking structure 130 in the X direction is within a range of about 3500 nanometers (nm) to about 4500 nm (e.g., from about 3750 nm to about 4250 nm, from about 3850 nm to about 4000 nm), and a length L of the masking structure 130 in the Y-direction is within a range of from about 1000 nm to about 2000 nm (e.g., from about 1250 nm to about 1750 nm, from about 1350 nm to about 1500 nm).

As shown in FIG. 1B, in some embodiments, the masking structure 130 within horizontal boundaries of an individual block 138 of the stack structure 102 is horizontally centered along a horizontal centerline $B_1$-$B_1$ in the Y-direction of the block 138 of the stack structure 102. In further embodiments, the masking structure 130 within horizontal boundaries of an individual block 138 of the stack structure 102 is horizontally offset in the Y-direction from the horizontal centerline $B_1$-$B_1$ of the block 138.

With continued reference to FIG. 1B, within horizontal boundaries of an individual block 138 of the stack structure 102, each opening 132 in the masking structure 130 may individually be horizontally centered about a horizontal center of an individual discrete conductive structure 128 vertically underlying the masking structure 130. In addition, the opening 132 may have horizontal dimensions (e.g., in the X-direction and the Y-direction) less than horizontal dimensions of the discrete conductive structure 128 associate therewith. As a result, portions 133 of the integral segments 131 of the masking structure 130 may horizontally overlap some of the discrete conductive structure 128 vertically underlying the masking structure 130. In FIG. 1B, the horizontal areas of the discrete conductive structures 128 vertically underlying and substantially horizontally aligned with the openings 132 in the masking structure 130 are depicted with dashed lines to more clearly illustrate the portions 133 of the integral segments 131 horizontally overlapping the discrete conductive structures 128. The horizontal size and shape of each of the openings 132, and the amount (e.g., magnitude) of horizontal overlap between the integral segments 131 of the masking structure 130 the discrete conductive structure 128 horizontally adjacent thereto, may be selected at least partially based on the horizontal shapes, horizontal sizes, and horizontal positions of the discrete conductive structures 128 within the horizontal boundaries of the central region 116 of the stadium structure 110. In some embodiments, each portion 133 of an individual integral segment 131 of the masking structure 130 overlapping a discrete conductive structure 128 overlaps the discrete conductive structure 128 by greater than or equal to about 1 nanometer (nm), such as greater than or equal to about 5 nm, greater than or equal to about 10 nm, greater than or equal to about 20 nm, greater than or equal to about 30 nm, or within a range of from about 1 nm to about 30 nm (e.g., from about 10 nm to about 30 nm, from about 20 nm to about 30 nm, about 30 nm).

With returned reference to FIG. 1A, optionally, a dielectric liner material 134 may substantially cover and surround horizontal boundaries (e.g., side surfaces, such as inner side surfaces defining the openings 132, and outer side surfaces) and a lower vertical boundary (e.g., a lower surface) of the masking structure 130. The dielectric liner material 134 may be horizontally interposed between horizontal boundaries of the masking structure 130 and the dielectric material 126, and may be vertically interposed between vertical boundaries of the masking structure 130 and each of the dielectric material 126 and the discrete conductive structures 128 of the source tier 122. If present, the dielectric liner material 134 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric liner material 134 is present and comprises $SiO_2$.

Thus, in accordance with embodiments of the disclosure, a microelectronic device comprises a stack structure, a stadium structure within the stack structure, a source tier underlying the stack structure, and a masking structure. The stack structure has tiers each comprising a conductive structure and an insulating structure vertically neighboring the conductive structure. The stadium structure comprises a forward staircase structure and having steps comprising edges of the tiers, a reverse staircase structure opposing the forward staircase structure and having additional steps comprising additional edges of the tiers, and a central region horizontally interposed between the forward staircase structure and the reverse staircase structure. The source tier comprises discrete conductive structures within horizontal boundaries of the central region of the stadium structure. The discrete conductive structures are horizontally separated from one another by dielectric material. The masking structure is confined within the horizontal boundaries of the central region of the stadium structure and is vertically interposed between the discrete conductive structures of the source tier and the central region of the stadium structure. The masking structure comprises segments horizontally covering portions of the dielectric material horizontally interposed between the discrete conductive structures.

Figure 2:
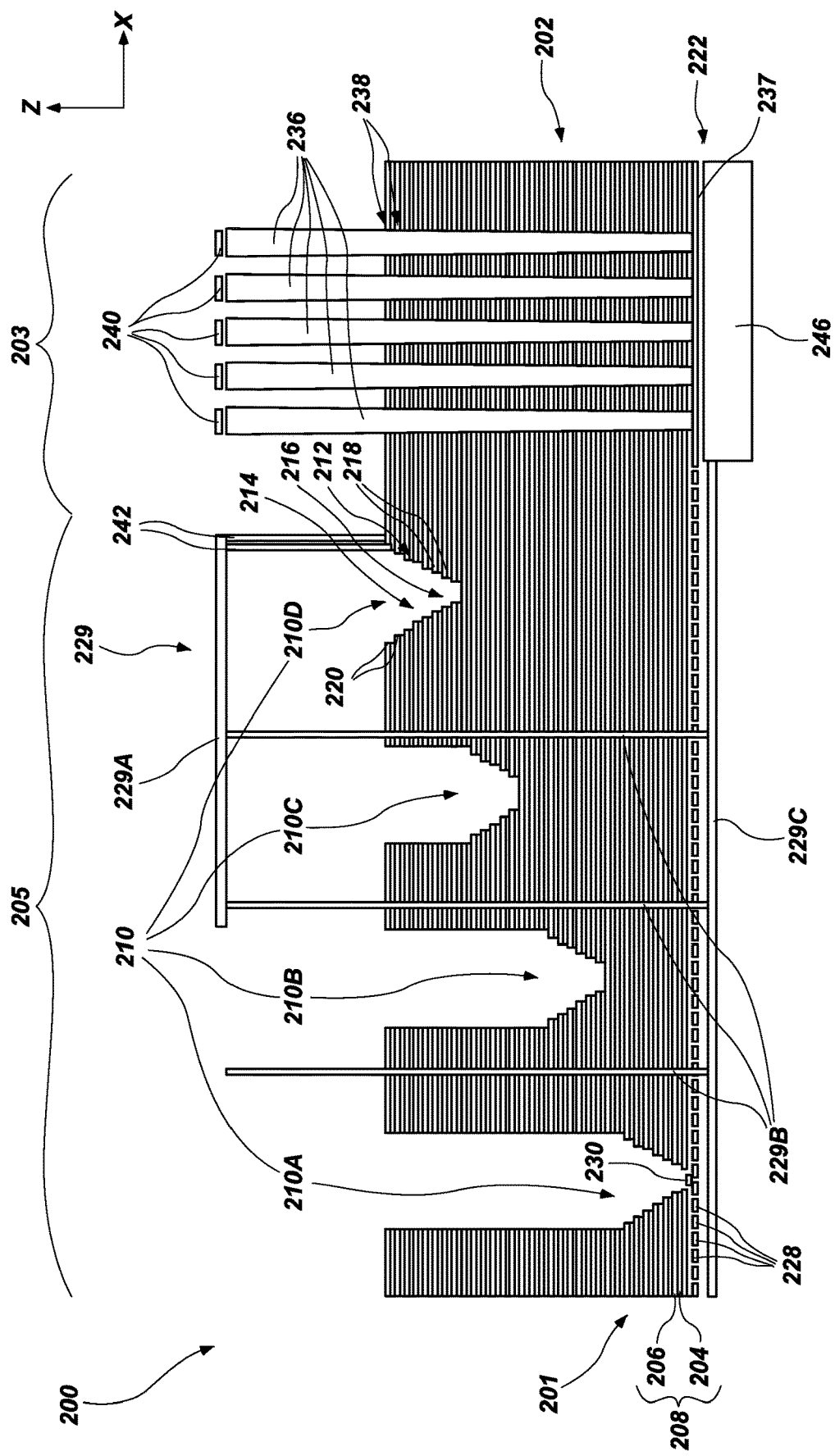
FIG. 2 is a partial cutaway perspective view of a microelectronic device, in accordance with embodiments of the disclosure.

Microelectronic device structures (e.g., the microelectronic device structure 100 previously described with reference to FIGS. 1A and 1B) in accordance with embodiments of the disclosure may be included in embodiments of microelectronic devices (e.g., memory devices, such as a 3D NAND Flash memory devices) of the disclosure. For example, FIG. 2 illustrates a simplified, partial cross-sectional view of a microelectronic device a microelectronic device 200 including a microelectronic device structure 201. The microelectronic device structure 201 may be substantially similar to the microelectronic device structure 100 previously described with reference to FIGS. 1A and 1B.

Referring to FIG. 2, the microelectronic device 200 includes a stack structure 202 including a vertically alternating (e.g., in the Z-direction) sequence of conductive structures 204 (e.g., access line plates, word line plates) and insulative structures 206 arranged in tiers 208. The tiers 208 of the stack structure 202 (including the conductive structures 204 and the insulative structures 206 thereof) may respectively be substantially similar to the tiers 108 of the stack structure 102 (including the conductive structures 104 and the insulative structures 106 thereof) previously described with reference to FIGS. 1A and 1B. In addition, as shown in FIG. 2, the stack structure 102 includes a memory array region 203, and a distributed stadium region 205 horizontally neighboring (e.g., in the X-direction) the memory array region 203. As described in further detail below, the microelectronic device 200 further includes additional components (e.g., features, structures, devices) within boundaries of the different horizontal regions (e.g., the memory array region 203, the distributed stadium region 205) of the stack structure 102.

Within horizontal boundaries (e.g., in the X-direction) of the memory array region 203 of the stack structure 202, the microelectronic device 200 may include vertically extending pillar structures 236, a source structure 237 (e.g., a source plate), digit lines 240 (e.g., bit lines), and a control unit 246. The control unit 246 may vertically underlie (e.g., in the Z-direction) the memory array region 203 of the stack structure 202. The source structure 237 may be included in a source tier 222 vertically interposed between the stack structure 202 and the control unit 246. The source tier 222 may include the source structure 237 within horizontal boundaries of the memory array region 203 of the stack structure 202, and discrete conductive structures 228 within the distributed stadium region 205 of the stack structure 202. The discrete conductive structures 228 may be substantially similar to the discrete conductive structures 128 of the source tier 122 previously described with reference to FIGS. 1A and 1B. The digit lines 240 may vertically overlie the memory array region 203 of the stack structure 202. The vertically extending pillar structures 236 vertically extend from or proximate the digit lines 240, through the memory array region 203 of stack structure 202, and to or proximate the source structure 237.

Each of the vertically extending pillar structures 236 may include a semiconductive pillar (e.g., a polysilicon pillar, a silicon-germanium pillar) at least partially surrounded by one or more charge storage structures (e.g., a charge trapping structure, such as a charge trapping structure comprising an oxide-nitride-oxide ("ONO") material; floating gate structures). Intersections of the vertically extending pillar structures 236 and the conductive structures 204 of the tiers 208 of the stack structure 202 may define vertically extending strings of memory cells 238 coupled in series with one another within the memory array region 203 of the stack structure 202. In some embodiments, the memory cells 238 formed at the intersections of the conductive structures 204 and the vertically extending pillar structures 236 within each the tiers 208 of the stack structure 202 comprise so-called "MONOS" (metal-oxide-nitride-oxide-semiconductor) memory cells. In additional embodiments, the memory cells 238 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In further embodiments, the memory cells 238 comprise so-called "floating gate" memory cells including floating gates (e.g., metallic floating gates) as charge storage structures. The floating gates may horizontally intervene between the central structures of the vertically extending pillar structures 236 and the conductive structures 204 of the different tiers 208 of the stack structure 202. The microelectronic device 200 may include any desired quantity and distribution of the vertically extending pillar structures 236 within the memory array region 203 of the stack structure 202.

The digit lines 240 may vertically overlie (e.g., in the Z-direction) an uppermost tier 208 of the stack structure 202. At least a portion of each of the digit lines 240 may be positioned within the horizontal boundaries (e.g., in the X-direction) of the memory array region 203 of the stack structure 202. The digit lines 240 may be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, a conductive metal carbide, and a conductive metal oxide), and at least one conductively doped semiconductor material (e.g., one or more of conductively doped Si, conductively doped Ge, and conductively doped SiGe). The digit lines 240 may be may be electrically coupled to the vertically extending pillar structures 236 (e.g., by way of conductive contact structures).

The source structure 237 of the source tier 222 may be located at substantially the same vertical position (e.g., in the Z-direction) within the microelectronic device structure 100 as the discrete conductive structures 228 of the source tier 222. At least one dielectric material (e.g., the dielectric material 126 previously described with reference to FIGS. 1A and 1B) may be horizontally interposed between the discrete conductive structures 228 and the source structure 237 and may also be horizontally interposed between the discrete conductive structures 228. Put another way, the dielectric material may horizontally intervene between and separate horizontally neighboring discrete conductive structures 228 of the source tier 222, and may also horizontally intervene between and separate the source structure 237 and the discrete conductive structures 228 of the source tier 222. The source structure may be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, a conductive metal carbide, and a conductive metal oxide), and at least one conductively doped semiconductor material (e.g., one or more of conductively doped Si, conductively doped Ge, and conductively doped SiGe). In some embodiments, the source structure 237 and the discrete conductive structures 228 have substantially the same material composition and substantially the same material distribution as one another. For example, the source structure 237 and the discrete conductive structures 228 may be formed (e.g., substantially simultaneously formed) by patterning (e.g., using a predetermined reticle configuration) the same electrically conductive material.

The control unit 246 (e.g., a control device) may include one or more of string driver circuitry, pass gates, circuitry for selecting gates, circuitry for selecting conductive lines, circuitry for amplifying signals, and circuitry for sensing signals. In some embodiments, the control unit 246 is substantially confined within horizontal boundaries of the memory array region 203 of the stack structure 202. The control unit 246 may, for example, be electrically coupled to the digit lines 240, the source structure 237 of the source tier 222, and the conductive routing structures 229. In some embodiments, the control unit 246 includes CMOS circuitry. In such embodiments, the control unit 246 may be characterized as having a "CMOS under Array" ("CuA") configuration.

With continued reference to FIG. 2, within horizontal boundaries (e.g., in the X-direction) of the distributed stadium region 205 of the stack structure 202, the microelectronic device 200 may include stadium structures 210 distributed within the stack structure 202. Each of the stadium structures 210 may individually include a forward staircase structure 212 including steps 218 (e.g., contact regions) defined by edges of some of the tiers 208, a reverse staircase structure 214 including additional steps 220 (e.g., contact regions) defined by additional edges of some of the tiers 208, and a central region 216 horizontally interposed between the forward staircase structure 212 and the reverse staircase structure 214. The forward staircase structure 212 (including the steps 218 thereof), the reverse staircase structure 214 (including the additional steps 220 thereof), and the central region 216 may respectively be substantially similar to the forward staircase structure 112 (including the steps 118 thereof), the reverse staircase structure 114 (including the additional steps 120 thereof), and the central region 116 of the stadium structure 110 previous described with reference to FIGS. 1A and 1B. In addition, within horizontal boundaries of the distributed stadium region 205 of the stack structure 202, the microelectronic device 200 may further include conductive contact structures 242 (e.g., access line contacts, word line contacts) contacting (e.g., physically contacting, electrically contacting) the steps 218 and/or the additional steps 220 of the stadium structures 210 to provide electrical access to the conductive structures 204 of the stack structure 202; conductive routing structures 229 (e.g., access line routing structures, word line routing structures) extending from and between the conductive contact structures 242 and the control unit 246; masking structures 230; and the discrete conductive structures 228 of the source tier 222.

As shown in FIG. 2, the distributed stadium region 205 of the stack structure 202 may include multiple (e.g., more than one) stadium structures 210 positioned at different elevations than one another within the stack structure 202. For example, the distributed stadium region 205 of the stack structure 102 may include a first stadium structure 210A, a second stadium structure 210B at a relatively higher vertical position (e.g., in the Z-direction) within the stack structure 202 than the first stadium structure 210A, a third stadium structure 210C at a relatively higher vertical position within the stack structure 202 than the second stadium structure 210B, and a fourth stadium structure 210D at a relatively higher vertical position within the stack structure 202 than the third stadium structure 210C. The different vertical positions of the different stadium structures 210 (e.g., the first stadium structure 210A, the second stadium structure 210B, the third stadium structure 210C, the fourth stadium structure 210D) permits electrical connections between the conductive structures 204 of the tiers 208 at the different vertical positions of the different stadium structures 210 and other components (e.g., the control unit 246) of the microelectronic device 200. For example, as shown in FIG. 2, the vertical position of the first stadium structure 210A may facilitate electrical connections to the conductive structures 204 of relatively lower tiers 208 of the stack structure 202; the vertical position of the second stadium structure 210B may facilitate electrical connections to the conductive structures 204 of relatively higher tiers 208 of the stack structure 202; the vertical position of the third stadium structure 210C may facilitate electrical connections to the conductive structures 204 of relatively even higher tiers 208 of the stack structure 202; and the vertical position of the fourth stadium structure 210D may facilitate electrical connections to the conductive structures 204 of relatively yet still even higher tiers 208 of the stack structure 202. The first stadium structure 210A may, for example, correspond to the stadium structure 110 previously described with reference to FIGS. 1A and 1B.

The distributed stadium region 205 of the stack structure 202 may include any desired quantity and distribution (e.g., spacing and arrangement) of the stadium structures 210. As shown in FIG. 2, in some embodiments, the distributed stadium region 205 of the stack structure 202 includes four (4) of the stadium structures 210; the stadium structures 210 are substantially uniformly (e.g., equally, evenly) spaced; and vertical positions (e.g., in the Z-direction) of the stadium structures 210 within the stack structure 202 become deeper (e.g., vertically farther from a uppermost surface of the stack structure 202, vertically closer to the lowermost surface of the stack structure 202) in a direction (e.g., the X direction) horizontally extending away from the memory array region 203 (and, hence, the vertically extending pillar structures 236 thereof) of the stack structure 202. In additional embodiments, the distributed stadium region 205 of the stack structure 202 may include a different quantity of the stadium structures 210 and/or a different distribution of the stadium structures 210 than that depicted in FIG. 2. For example, the distributed stadium region 205 of the stack structure 202 may include more than four (4) of the stadium structures 210 (e.g., greater than or equal to five (5) of the stadium structures 210, greater than or equal to ten (10) of the stadium structures 210, greater than or equal to twenty-five (25) of the stadium structures 210, greater than or equal to fifty (50) of the stadium structures 210), or less than four (4) of the stadium structures 210 (e.g., less than or equal to three (3) of the stadium structures 210, less than or equal to two (2) of the stadium structures 210, only one (1) of the stadium structures 210). As another example, the stadium structures 210 may be at least partially non-uniformly (e.g., non-equally, non-evenly) spaced, such that at least one of the stadium structures 210 is separated from at least two (2) other of the stadium structures 210 horizontally neighboring (e.g., in the X-direction) the at least one stadium structure 210 by different (e.g., non-equal) distances. As an additional non-limiting example, vertical positions (e.g., in the Z-direction) of the stadium structures 210 within the stack structure 202 may become shallower (e.g., vertically closer to a uppermost surface of the stack structure 202, vertically farther from the lowermost surface of the stack structure 202) in a direction (e.g., the X direction) horizontally extending away from the memory array region 203 of the stack structure 202, or may vary in another manner (e.g., may alternate between relatively deeper and relatively shallower vertical positions, may alternate between relatively shallower and relatively deeper vertical positions) in a direction horizontally extending away from the memory array region 203 of the stack structure 202.

With continued reference to FIG. 2, the masking structure 230 within distributed stadium region 205 of the stack structure 202 may be positioned within horizontal boundaries of the central region 216 of the first stadium structure 210A. The masking structure 230 may be vertically interposed between the first stadium structure 210A and the discrete conductive structures 228 of the source tier 222. The masking structure 230 may be substantially similar to the masking structure 130 previously described with reference to FIGS. 1A and 1B.

Still referring to FIG. 2, the conductive contact structures 242 may be coupled to the conductive structures 204 of the tiers 208 at the steps 218 and/or the additional steps 220 of the stadium structures 210, and may electrically couple the conductive structures 204 to the conductive routing structures 229 (and, hence, the control unit 246) of the microelectronic device 200. The conductive contact structures 242 may be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, a conductive metal carbide, and a conductive metal oxide), and at least one conductively doped semiconductor material (e.g., one or more of conductively doped Si, conductively doped Ge, and conductively doped SiGe). Each of the conductive contact structures 242 may have substantially the same material composition, or at least one of the conductive contact structures 242 may have a different material composition than at least one other of the conductive contact structures 242.

Each of tiers 208 of the stack structure 202 may be coupled to at least one of the conductive contact structures 242 at one or more of the steps 218 and/or the additional steps 220 of one or more of the stadium structures 210. For each of the stadium structures 210 (e.g., the first stadium structure 210A, the second stadium structure 210B, the third stadium structure 210C, the fourth stadium structure 210D), the conductive contact structures 242 may be formed on or over a single (e.g., only one) staircase structure thereof (e.g., the forward staircase structure 212 thereof, or the reverse staircase structure 214 thereof), or may be formed on or over multiple (e.g., more than one) of the staircase structures thereof (e.g., the forward staircase structure 212 thereof and the reverse staircase structure 214 thereof). In addition, conductive contact structures 242 formed on or over the same staircase structure (e.g., the forward staircase structure 212 or the reverse staircase structure 214) of the same stadium structure 210 (e.g., the first stadium structure 210A, the second stadium structure 210B, the third stadium structure 210C, or the fourth stadium structure 210D) may be substantially horizontally aligned with one another (e.g., in a horizontal direction orthogonal to the X-direction shown in FIG. 2), or may be at least partially non-aligned (e.g., offset) with one another (e.g., in a horizontal direction orthogonal to the X-direction shown in FIG. 2).

With continued reference to FIG. 2, the conductive routing structures 229 may electrically connect the conductive contact structures 242 and control logic devices (e.g., string drivers) of the control unit 246. The conductive routing structures 229 may, for example, extend from the conductive contact structures 242, through the distributed stadium region 205 of the stack structure 202 and to the control logic devices of the control unit 246. As shown in FIG. 2, the conductive routing structures 229 may include horizontally extending conductive routing structures 229A, vertically extending conductive routing structures 229B, and additional horizontally extending conductive routing structures 229C. At least some of the horizontally extending conductive routing structures 229A may horizontally extend (e.g., in one or more of the X-direction and the Y-direction) from the conductive contact structures 242 to at least some the vertically extending conductive routing structures 229B, and at least some of the additional horizontally extending conductive routing structures 229C may horizontally extend (e.g., in one or more of the X-direction and the Y-direction) from the vertically extending conductive routing structures 229B to the control unit 246. Thus, the conductive routing structures 229 may form an electrical connection between control logic devices of the control unit 246 and the conductive structures 204 of the different tiers 208 of the stack structure 202 to provide electrical access to the conductive structures 204 (e.g., for reading, writing, or erasing data associated with the memory cells 238 within the memory array region 203 of the stack structure 202).

The conductive routing structures 229 may be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, a conductive metal carbide, and a conductive metal oxide), and at least one conductively doped semiconductor material (e.g., one or more of conductively doped Si, conductively doped Ge, and conductively doped SiGe). Each of the conductive routing structures 229 may have substantially the same material composition, or at least one of the conductive routing structures 229 may have a different material composition than at least one other of the conductive routing structures 229.

Thus, in accordance with embodiments of the disclosure, a memory device comprises a stack structure, a stadium structure, discrete conductive structures, a conductive masking structure, and strings of memory cells. The stack structure comprises a vertically alternating sequence of conductive structures and insulative structures arranged in tiers. Each of the tiers individually comprises at least one of the conductive structures and at least one of the insulative structures. The stadium structure is within the stack structure and comprises opposing staircase structures individually having steps comprising horizontal ends of at least some the tiers, and a central region horizontally intervening between the opposing staircase structures. The discrete conductive structures underlie the stack structure. A group of the discrete conductive structures is located within horizontal boundaries of the central region of the stadium structure. The conductive masking structure is interposed between the discrete conductive structures and the central region of stadium structure. The strings of memory cells vertically extend through the stack structure.

Furthermore, in accordance with additional embodiments of the disclosure, a 3D NAND Flash memory device comprises a stack structure, a source tier, a masking structure, and semiconductive pillar structures. The stack structure comprises vertically alternating conductive structures and insulating structures arranged in tiers. The stack structure further comprises a distributed stadium region and a memory array region horizontally neighboring the distributed stadium region. The distributed stadium region comprises stadium structures located at different vertical positions than one another within the stack structure. The stadium structures each individually comprise a forward staircase structure comprising edges of a portion of the tiers, a reverse staircase structure mirroring the forward staircase structure and comprising additional edges of the portion of the tiers, and a central region horizontally interposed between the forward staircase structure and the reverse staircase structure. The source tier vertically underlies the stack structure and comprises a source structure within horizontal boundaries of the memory array region of the stack structure, and discrete conductive structures within horizontal boundaries of the distributed stadium region of the stack structure. The masking structure is vertically interposed between the discrete conductive structures and the stack structure, and is substantially horizontally confined within horizontal boundaries of the central region of one of the stadium structures positioned at a relatively lower vertical position within the stack structure. The semiconductive pillar structures are within horizontal boundaries of the memory array region of the stack structure and vertically extend through the stack structure.

Figure 3A:
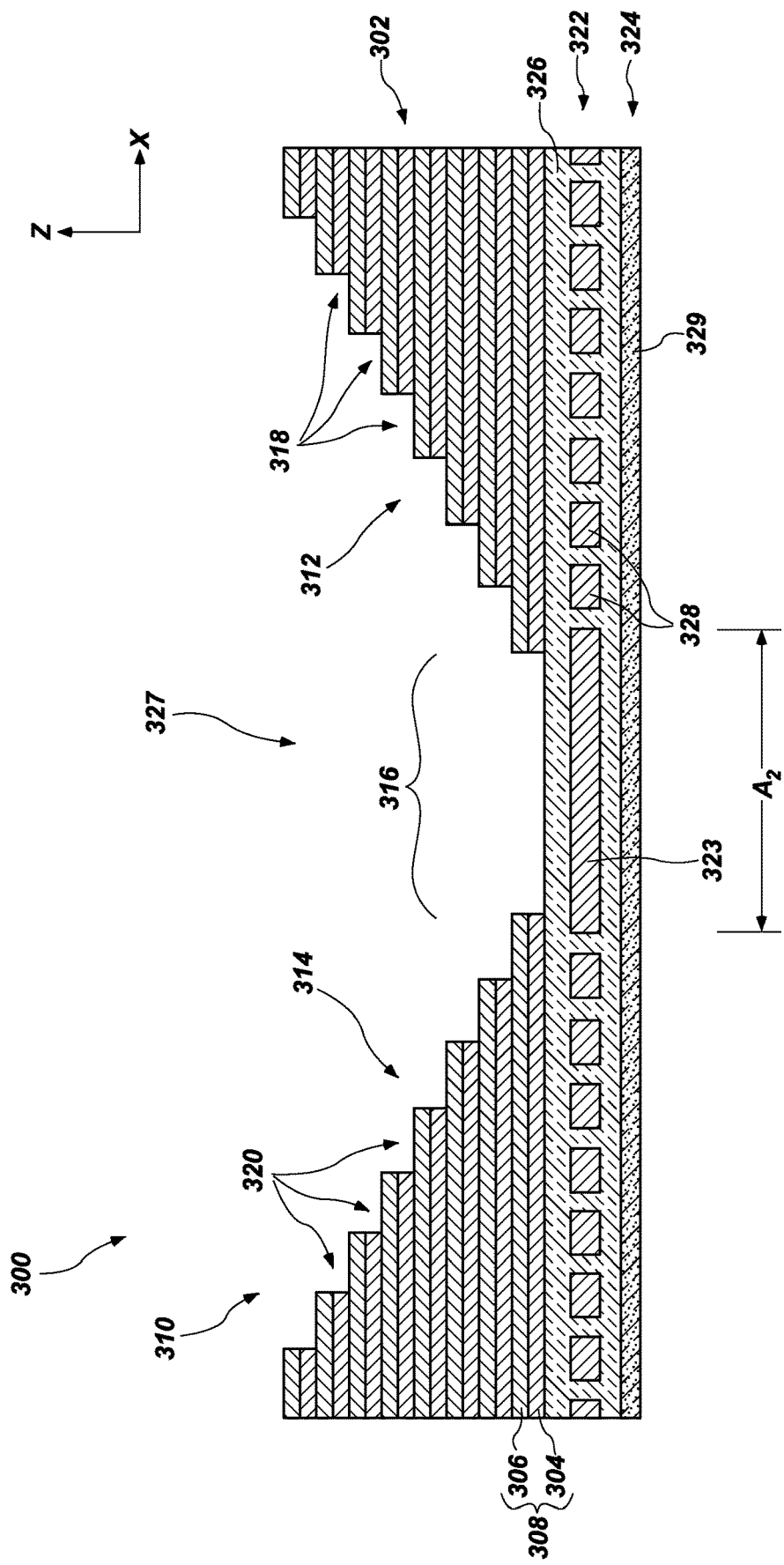
FIG. 3A is a simplified, partial cross-sectional view of a microelectronic device structure, in accordance with embodiments of the disclosure.
Figure 3B:
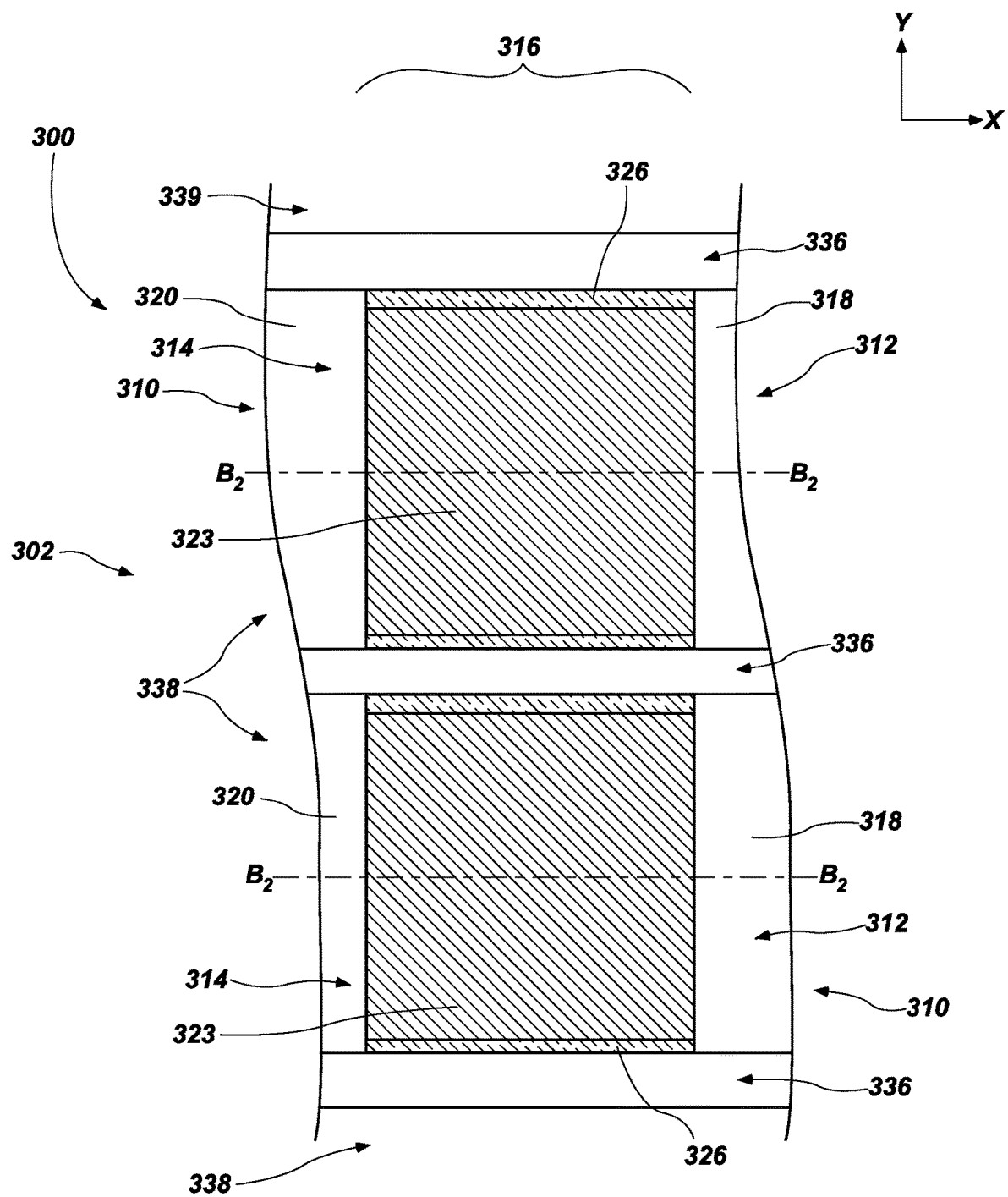
FIG. 3B is a simplified, partial top-down view of a section of the microelectronic device structure shown in FIG. 3A.

In additional embodiments, a microelectronic device structure of the disclosure may include features (e.g., structures, materials, tiers) different than those of the microelectronic device structure 100 previously described with reference to FIGS. 1A and 1B (and the microelectronic device structure 201 of the microelectronic device 200 previously described with reference to FIG. 2). For example, FIG. 3A is a simplified, partial cross-sectional view of a microelectronic device structure 300 of a microelectronic device (e.g., a semiconductor device; a memory device, such as a 3D NAND Flash memory device), in accordance with additional embodiments of the disclosure. FIG. 3B is a simplified, partial top-down view of a section $A_2$ (e.g., portion, region) of the microelectronic device structure 100 shown in FIG. 3A. For clarity and ease of understanding of the drawings and related description, some vertically higher components (e.g., features, structures, devices) of the microelectronic device structure 300 overlying relatively vertically lower components of the microelectronic device structure 300 have been omitted in FIG. 3B to focus on particular aspects of the microelectronic device structure 300 in FIG. 3B. Throughout FIGS. 3A and 3B and the associated description below, features (e.g., structures, materials, regions) functionally similar to features of the microelectronic device structure 100 previously described with reference to one or more of FIGS. 1A and 1B are referred to with similar reference numerals incremented by 100. To avoid repetition, not all features shown in FIGS. 3A and 3B are described in detail herein. Rather, unless described otherwise below, in FIGS. 3A and 3B, a feature designated by a reference numeral that is a 100 increment of the reference numeral of a feature previously described with reference to one or more of FIGS. 1A and 1B will be understood to be substantially similar to and formed in substantially the same manner as the previously described feature.

Referring collectively to FIGS. 3A and 3B, a configuration of a source tier 322 (FIG. 3A) of the microelectronic device structure 300 may be different than a configuration of the source tier 122 (FIG. 1B) of the microelectronic device structure 100 previously described with reference to FIGS. 1A and 1B. For example, as depicted in FIG. 3A, the source tier 322 of the microelectronic device structure 300 may include discrete conductive structures 328 and additional discrete conductive structures 323. Individual additional discrete conductive structures 323 of the source tier 322 may have relatively larger horizontal dimensions than individual discrete conductive structures 328 of the source tier 322, and may be horizontally interposed between (e.g., in the X-direction) some horizontally neighboring discrete conductive structures 328 of the source tier 322.

Within horizontal boundaries of an individual block 338 (FIG. 3B) of a stack structure 302 of the microelectronic device structure 300, a single (e.g., only one) additional discrete conductive structures 323 may be positioned within horizontal boundaries of a central region 316 of a stadium structure 310. The additional discrete conductive structure 323 may extend continuously in a first horizontal direction (e.g., the X-direction) across the central region 316 from a location at or within horizontal boundaries of a vertically lowermost step 318 of a forward staircase structure 312 of the stadium structure 310 to a location at or within horizontal boundaries of a vertically lowermost additional step 320 of a reverse staircase structure 314 of the stadium structure 310. In addition, as shown in FIG. 3B, the additional discrete conductive structure 323 may extend continuously in a second horizontal direction (e.g., the Y-direction) orthogonal to the first direction across the central region 316 from a location at or horizontally proximate a first slot 336 horizontally neighboring a first side of the block 338 to another location at or horizontally proximate a second slot 336 horizontally neighboring a second, opposing side of the block 338. As shown in FIG. 3B, the additional discrete conductive structure 323 may horizontally extend across substantially all of the horizontal area of the central region 316 of the stadium structure 310. Discrete conductive structures 328 (FIG. 3A) within horizontal boundaries of the individual block 338 (FIG. 3B) of the stack structure 302 may each be located outside of the horizontal boundaries of the central region 316 of the stadium structure 310.

The additional discrete conductive structures 323 of the source tier 322 may each individually exhibit a horizontal cross-sectional shape complementary to a horizontal shape of the central region 316 of the stadium structure 310 vertically thereover. In some embodiments, one or more (e.g., each) of the additional discrete conductive structures 323 exhibits a generally quadrilateral (e.g., generally rectangular, generally square) horizontal cross-sectional shape. Each of the additional discrete conductive structures 323 may exhibit substantially the same geometric configuration (e.g., the same dimensions and the same shape) as each other of the additional discrete conductive structures 323, or at least one of the additional discrete conductive structures 323 may exhibit a different geometric configuration (e.g., one or more different dimensions, a different shape) than at least one other of the additional discrete conductive structures 323.

As shown in FIG. 3B, in some embodiments, each additional discrete conductive structure 323 within horizontal boundaries of an individual block 338 of the stack structure 302 is horizontally centered along a horizontal centerline $B_2$-$B_2$ in the Y-direction of the block 338 of the stack structure 302. In further embodiments, one or more additional discrete conductive structures 323 within horizontal boundaries of an individual block 338 of the stack structure 302 are horizontally offset in the Y-direction from the horizontal centerline $B_2$-$B_2$ of the block 338. In addition, referring to FIG. 3A, the additional discrete conductive structures 323 of the source tier 322 may be located at substantially the same vertical position (e.g., in the Z-direction) within the microelectronic device structure 300 as the discrete conductive structures 328 of the source tier 322.

The additional discrete conductive structures 323 may each individually be formed of and include at least one electrically conductive material, such as one or more of at least one metal (e.g., one or more of W, Ti, Mo, Nb, V, Hf, Ta, Cr, Zr, Fe, Ru, Os, Co, Rh, Ir, Ni, Pa, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, and a conductive metal carbide, a conductive metal oxide), and at least one conductively doped semiconductor material (e.g., one or more of conductively doped Si, conductively doped Ge, and conductively doped SiGe). A material composition of the additional discrete conductive structures 323 may be substantially the same as a material composition of the discrete conductive structures 328, or the material composition of the additional discrete conductive structures 323 may be different than the material composition of the discrete conductive structures 328. In some embodiments, the additional discrete conductive structures 323 are each formed of and include conductively doped polycrystalline silicon. Each of the additional discrete conductive structures 323 may individually include a substantially homogeneous distribution of the at least one electrically conductive material, or a substantially heterogeneous distribution of the at least one electrically conductive material. In some embodiments, each of the additional discrete conductive structures 323 of the source tier 322 exhibits a substantially homogeneous distribution of electrically conductive material. In additional embodiments, at least one (e.g., each) of the additional discrete conductive structures 323 of the source tier 322 exhibits a substantially heterogeneous distribution of at least one conductive material. The additional discrete conductive structures 323 may, for example, individually be formed of and include a stack of at least two different conductive materials.

As shown in FIG. 3A, at least one dielectric material 326 may be horizontally interposed between the discrete conductive structures 328 and the additional discrete conductive structures 323. Put another way, the dielectric material 326 may horizontally intervene between and separate the additional discrete conductive structures 323 and the discrete conductive structures 328 of the source tier 322.

As shown in FIGS. 3A and 3B, the microelectronic device structure 300 may be substantially free of masking structures and dielectric liner material respectively similar to the mask structures 130 and the dielectric liner material 134 of the microelectronic device structure 100 previously described with reference to FIGS. 1A and 1B. For example, within horizontal boundaries of a central region 316 of a stadium structure 310 with the stack structure 302, only the dielectric material 326 may be present within the space vertically intervening between a lowermost vertical boundary the stack structure 302 and uppermost vertical boundaries of an additional discrete conductive structure 323 of the source tier 322. The configuration and position of the additional discrete conductive structure 323 may substantially impede or prevent undesirable damage to one or more structures (e.g., one or more of conductive routing structures 329 of the conductive routing tier 324) vertically underlying the source tier 322 during at least one material removal process employed to form the stadium structure 310 (and, hence, the trench 327) without having to form a mask structure (e.g., the mask structure 130 (FIGS. 1A and 1B)) vertically between the lowermost vertical boundary the stack structure 302 and the uppermost vertical boundaries of the additional discrete conductive structure 323.

The microelectronic device structure 300 may be included in embodiments of microelectronic devices of the disclosure. For example, the microelectronic device structure 300 may be included within the microelectronic device 200 previously described with reference to FIG. 2, in place of the microelectronic device structure 201 (which, as previously described, may be substantially similar to the microelectronic device structure 100 previously described with reference to FIGS. 1A and 1B).

Thus, in accordance with embodiments of the disclosure, a microelectronic device comprises a stack structure, a stadium structure within the stack structure, and a source tier vertically below the stack structure. The stack structure comprises tiers each comprising an electrically conductive structure and a dielectric structure vertically neighboring the electrically conductive structure. The stadium structure is within the stack structure and comprises opposing staircase structures and a central region. The opposing staircase structures mirror one another and each have steps comprising edges of at least some of the tiers. The central region is horizontally interposed between the opposing staircase structures. The source tier is vertically below the stack structure and comprises discrete conductive structures and an additional discrete conductive structure. The discrete conductive structures are within horizontal boundaries of the opposing staircase structures of the stadium structure. The additional discrete conductive structure is within horizontal boundaries of the central region of the stadium structure and has relatively larger horizontal dimensions than one or more of the discrete conductive structures.

Figure 4:
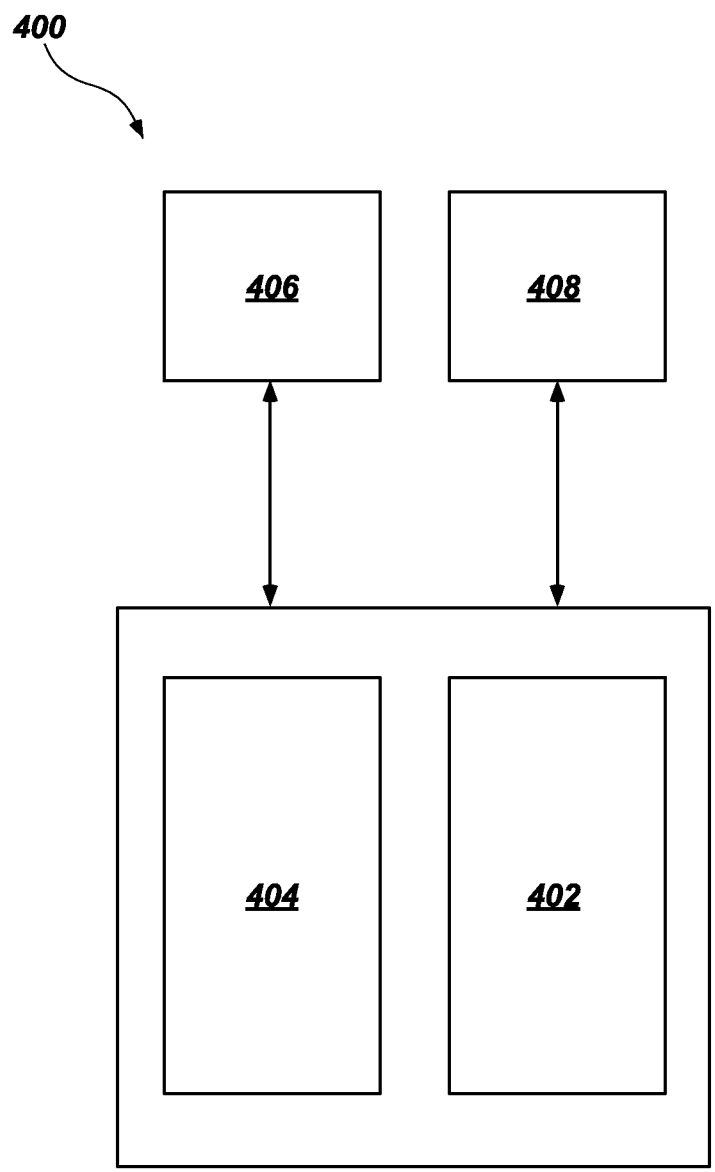
FIG. 4 is a schematic block diagram illustrating an electronic system, in accordance with embodiments of the disclosure.

Microelectronic device structures (e.g., the microelectronic device structure 100 previously described with reference to FIGS. 1A and 1B; the microelectronic device structure 300 previously described with reference to FIGS. 3A and 3B) and microelectronic devices (e.g., the microelectronic device 200 previously described with reference to FIG. 2) in accordance with embodiments of the disclosure may be used in embodiments of electronic systems of the disclosure. For example, FIG. 4 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 400 includes at least one memory device 402. The memory device 402 may comprise, for example, an embodiment of one or more of a microelectronic device structure (e.g., the microelectronic device structure 100 previously described with reference to FIGS. 1A and 1B) and a microelectronic device (e.g., the microelectronic device 200 previously described with reference to FIG. 2) previously described herein. The electronic system 400 may further include at least one electronic signal processor device 404 (often referred to as a "microprocessor"). The electronic signal processor device 404 may, optionally, include an embodiment of one or more of a microelectronic device structure (e.g., the microelectronic device structure 100 previously described with reference to FIGS. 1A and 1B; the microelectronic device structure 300 previously described with reference to FIGS. 3A and 3B) and a microelectronic device (e.g., the microelectronic device 200 previously described with reference to FIG. 2). While the memory device 402 and the electronic signal processor device 404 are depicted as two (2) separate devices in FIG. 4, in additional embodiments, a single (e.g., only one) memory/processor device having the functionalities of the memory device 402 and the electronic signal processor device 404 is included in the electronic system 400. In such embodiments, the memory/processor device may include one or more of a microelectronic device structure (e.g., the microelectronic device structure 100 previously described with reference to FIGS. 1A and 1B) and a microelectronic device (e.g., the microelectronic device 200 previously described with reference to FIG. 2) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure, a stadium structure, a source tier, and a masking structure. The stack structure comprises tiers each comprising an electrically conductive structure and a dielectric structure vertically neighboring the electrically conductive structure. The stadium structure is within the stack structure and exhibits steps comprising edges of at least some of the tiers. The source tier is vertically below the stack structure and comprises discrete conductive structures within horizontal boundaries of the stadium structure. The masking structure is substantially confined within horizontal boundaries of a horizontally central region of the stadium structure free of the steps. The masking structure comprises at least one masking material horizontally extending between and partially horizontally overlapping some of the discrete conductive structures of the source tier within the horizontal boundaries of the horizontally central region of the stadium structure.

The structures (e.g., the microelectronic device structure 100, the microelectronic device structure 300), devices (e.g., the microelectronic device 200), and systems (e.g., the electronic device 400) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the configurations of the source tiers and masking structures of the disclosure may reduce the risk of undesirable damage (e.g., undesirable delamination, undesirable etching) to one or more components of the microelectronic devices of the disclosure as compared to conventional microelectronic device configurations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
    a stack structure having tiers each comprising a conductive structure and an insulating structure vertically neighboring the conductive structure;
    a stadium structure within the stack structure and comprising:
        a forward staircase structure and having steps comprising edges of the tiers;
        a reverse staircase structure opposing the forward staircase structure and having additional steps comprising additional edges of the tiers; and
        a central region horizontally interposed between the forward staircase structure and the reverse staircase structure;
    a source tier underlying the stack structure and comprising discrete conductive structures within horizontal boundaries of the central region of the stadium structure, the discrete conductive structures horizontally separated from one another by dielectric material; and
    a masking structure confined within the horizontal boundaries of the central region of the stadium structure and vertically interposed between the discrete conductive structures of the source tier and the central region of the stadium structure, the masking structure comprising:
        segments horizontally covering portions of the dielectric material horizontally interposed between the discrete conductive structures; and
        openings horizontally interposed between the segments and filled with additional dielectric material, horizontal centers of the openings substantially aligned with horizontal centers of some of the discrete conductive structures of the source tier.

2. The microelectronic device of claim 1, wherein the source tier comprises:
    rows of the discrete conductive structures extending in a first horizontal direction; and
    columns of the discrete conductive structures extending in a second horizontal direction orthogonal to the first horizontal direction.

3. The microelectronic device of claim 1, wherein the discrete conductive structures of the source tier comprise conductively doped polycrystalline silicon.

4. The microelectronic device of claim 1, wherein outermost horizontal boundaries of the masking structure are smaller than horizontal boundaries of the central region of the stadium structure.

5. The microelectronic device of claim 1, wherein some of the segments of the masking structure partially horizontally overlap some of the discrete conductive structures.

6. The microelectronic device of claim 1, wherein the openings within the masking structure are confined within horizontal boundaries of the some of the discrete conductive structures.

7. The microelectronic device of claim 1, wherein the masking structure comprises an electrically conductive material.

8. The microelectronic device of claim 7, wherein the electrically conductive material comprises elemental tungsten.

9. The microelectronic device of claim 1, wherein at least one of the segments of the masking structure continuously horizontally extends from one of the discrete conductive structures to an additional one of the discrete conductive structures horizontally neighboring the one of the discrete conductive structures.

10. The microelectronic device of claim 9, wherein the at least one of the segments of the masking structure horizontally overlaps each of the one of the discrete conductive structures and the additional one of the discrete conductive structures.

11. A memory device, comprising:
    a stack structure comprising a vertically alternating sequence of conductive structures and insulative structures arranged in tiers, each of the tiers individually comprising at least one of the conductive structures and at least one of the insulative structures;
    a stadium structure within the stack structure and comprising:
        opposing staircase structures individually having steps comprising horizontal ends of at least some the tiers; and
        a central region horizontally intervening between the opposing staircase structures;
    discrete conductive structures underlying the stack structure, a group of the discrete conductive structures located within horizontal boundaries of the central region of the stadium structure;
    a conductive masking structure interposed between the discrete conductive structures and the central region of stadium structure;
    strings of memory cells vertically extending through the stack structure;
    digit lines overlying the stack structure and electrically coupled to the strings of memory cells;
    a source structure underlying the stack structure and electrically coupled to the strings of memory cells;
    conductive contact structures on at least some of the steps of the opposing staircase structures of the stadium structure;
    conductive routing structures electrically coupled to the conductive contact structures; and
    a control device electrically coupled to the source structure, the digit lines, and the conductive routing structures.

12. The memory device of claim 11, wherein the source structure and the discrete conductive structures are located at substantially the same vertical position as one another.

13. The memory device of claim 11, wherein the conductive masking structure is substantially confined within horizontal boundaries of the central region of the stadium structure, the conductive masking structure horizontally extending over less than all of the group of the discrete conductive structures located within the horizontal boundaries of the central region of the stadium structure.

14. The memory device of claim 13, wherein a horizontal center of conductive masking structure is substantially aligned with a horizontal center of the central region of the stadium structure.

15. The memory device of claim 13, wherein the conductive masking structure further comprises openings vertically extending therethrough, horizontal centers of the openings substantially aligned with horizontal centers of some of the discrete conductive structures of the group of the discrete conductive structures.

16. The memory device of claim 15, further comprising a dielectric material horizontally interposed between horizontally neighboring discrete conductive structures of the group of the discrete conductive structures, vertically interposed between the group of the discrete conductive structures and the conductive masking structure, and filling the openings within the conductive masking structure.

17. A 3D NAND Flash memory device, comprising:
a stack structure comprising vertically alternating conductive structures and insulating structures arranged in tiers, the stack structure comprising:
a distributed stadium region comprising stadium structures located at different vertical positions than one another within stack structure, the stadium structures each individually comprising:
a forward staircase structure comprising edges of a portion of the tiers;
a reverse staircase structure mirroring the forward staircase structure and comprising additional edges of the portion of the tiers; and
a central region horizontally interposed between the forward staircase structure and the reverse staircase structure; and
a memory array region horizontally neighboring the distributed stadium region;
a source tier vertically underlying the stack structure and comprising:
a source structure within horizontal boundaries of the memory array region of the stack structure; and
discrete conductive structures within horizontal boundaries of the distributed stadium region of the stack structure;
a masking structure vertically interposed between the discrete conductive structures and the stack structure, and substantially horizontally confined within horizontal boundaries of the central region of one of the stadium structures positioned at a relatively lower vertical position within the stack structure;
semiconductive pillar structures within horizontal boundaries of the memory array region of the stack structure and vertically extending through the stack structure;
digit lines vertically overlying and within horizontal boundaries of the memory array region of the stack structure, the semiconductive pillar structures in electrical communication with the digit lines and the source structure; and
a control device vertically overlying and within horizontal boundaries of the memory array region, the control device comprising CMOS circuitry in electrical communication with the source structure, the digit lines, and the conductive structures of the tiers of the stack structure.

18. The 3D NAND Flash memory device of claim 17, wherein the discrete conductive structures of the source tier are electrically isolated from another and the source structure by at least one dielectric material.

19. The 3D NAND Flash memory device of claim 17, wherein the masking structure comprises an electrically conductive material horizontally extending between and partially horizontally overlapping some of the discrete conductive structures horizontally neighboring one another within the horizontal boundaries of the central region of the one of the stadium structures.

20. The 3D NAND Flash memory device of claim 19, wherein the masking structure further comprises filled openings vertically extending through the electrically conductive material and horizontally overlapping the some of the discrete conductive structures, the filled openings having dielectric material therein.

21. A 3D NAND Flash memory device, comprising:
a stack structure comprising vertically alternating conductive structures and insulating structures arranged in tiers, the stack structure comprising:
a distributed stadium region comprising stadium structures located at different vertical positions than one another within stack structure, the stadium structures each individually comprising:
a forward staircase structure comprising edges of a portion of the tiers;
a reverse staircase structure mirroring the forward staircase structure and comprising additional edges of the portion of the tiers; and
a central region horizontally interposed between the forward staircase structure and the reverse staircase structure; and
a memory array region horizontally neighboring the distributed stadium region;
a source tier vertically underlying the stack structure and comprising:
a source structure within horizontal boundaries of the memory array region of the stack structure; and
discrete conductive structures within horizontal boundaries of the distributed stadium region of the stack structure;
a masking structure vertically interposed between the discrete conductive structures and the stack structure, and substantially horizontally confined within horizontal boundaries of the central region of one of the stadium structures positioned at a relatively lower vertical position within the stack structure;
a dielectric liner material substantially covering and surrounding horizontal boundaries and lower vertical boundaries of the masking structure; and
semiconductive pillar structures within horizontal boundaries of the memory array region of the stack structure and vertically extending through the stack structure.

22. An electronic system, comprising:
an input device;
an output device;
a processor device operably coupled to the input device and the output device; and
a memory device operably coupled to the processor device and comprising at least one microelectronic device structure comprising:
a stack structure comprising tiers each comprising an electrically conductive structure and a dielectric structure vertically neighboring the electrically conductive structure;
strings of memory cells vertically extending through the stack structure;

a stadium structure within the stack structure and having steps comprising edges of at least some of the tiers;
a source tier vertically below the stack structure and comprising:
discrete conductive structures within horizontal boundaries of the stadium structure; and
a source structure underlying electrically coupled to the strings of memory cells;
a masking structure substantially confined within horizontal boundaries of a horizontally central region of the stadium structure free of the steps, the masking structure comprising at least one masking material horizontally extending between and partially horizontally overlapping some of the discrete conductive structures of the source tier within the horizontal boundaries of the horizontally central region of the stadium structure;
digit lines overlying the stack structure and in electrical communication with the strings of memory cells;
conductive contact structures on at least some of the steps of the stadium structure;
conductive routing structures in electrical communication with the conductive contact structures; and
a control device in electrical communication with the source structure, the digit lines, and the conductive routing structures.

23. The electronic system of claim 22, wherein the memory device comprises a 3D NAND Flash memory device.

* * * * *

UNITED STATES PATENT AND TRADEMARK OFFICE
CERTIFICATE OF CORRECTION

PATENT NO. : 11,424,262 B2
APPLICATION NO. : 16/821818
DATED : August 23, 2022
INVENTOR(S) : Shuangqiang Luo and Nancy M. Lomeli Page 1 of 1

It is certified that error appears in the above-identified patent and that said Letters Patent is hereby corrected as shown below:

In the Specification

| | | |
|---|---|---|
| Column 1, | Line 64, | change "Accordingly there" to --Accordingly, there-- |
| Column 8, | Line 53, | change "with Sift." to --with $SiO_2$.-- |
| Column 11, | Line 22, | change "(e.g., Sift)" to --(e.g., $SiO_2$)-- |

Signed and Sealed this
Fourteenth Day of February, 2023

Katherine Kelly Vidal
*Director of the United States Patent and Trademark Office*